United States Patent
Yamada et al.

[11] Patent Number: 5,914,283
[45] Date of Patent: Jun. 22, 1999

[54] LOW DIELECTRIC POLYMER AND FILM, SUBSTRATE AND ELECTRONIC PART USING THE SAME

[75] Inventors: Toshiaki Yamada; Takeshi Takahashi; Atsushi Yakuwa; Hideaki Ninomiya; Naoyuki Amaya; Naoki Saito; Yasuhiro Imamura; Norihiro Kaiya, all of Tokyo, Japan

[73] Assignee: TDK Corporation, Tokyo, Japan

[21] Appl. No.: 08/790,431

[22] Filed: Jan. 29, 1997

[30] Foreign Application Priority Data

Feb. 5, 1996 [JP] Japan .................................... 8-042073

[51] Int. Cl.⁶ ..................... B32B 27/04; B32B 27/06; B32B 27/30
[52] U.S. Cl. ..................... 442/117; 442/173; 442/180; 428/522; 428/523; 428/338; 428/339; 526/319; 526/321; 526/323.1; 526/324; 526/325
[58] Field of Search ...................... 428/522, 523, 428/338, 339; 526/319, 321, 323.1, 324, 325; 442/117, 173, 180

[56] References Cited

U.S. PATENT DOCUMENTS 3,981,846  9/1976  Freytag et al. ........................ 526/227
4,636,229  1/1987  Itoh et al. ............................... 55/158

FOREIGN PATENT DOCUMENTS 52-31272  8/1977  Japan .
57-060547  4/1982  Japan .
2-269130  11/1990  Japan .
6-192392  7/1994  Japan .

OTHER PUBLICATIONS

Patent Abstracts of Japan, vol. 15, No. 21, Jan. 17, 1991, and JP–02–266930, Oct. 31, 1990.
Patent Abstracts of Japan, vol. 16, No. 505, Oct. 19, 1992, and JP–04–188597, Jul. 7, 1992.
Whelan, Tony, Polymer Technology Dictionary, Chapman & Hall, London, 1994, pp. 171–172, Jan. 1994.

*Primary Examiner*—Vivian Chen
*Attorney, Agent, or Firm*—Oblon, Spivak, McClelland, Maier & Neustadt, P.C.

[57] ABSTRACT

A film comprises glass fiber impregnated with a low dielectric polymer obtained by polymerizing a monomeric composition comprising a fumaric acid diester monomer and optionally a vinyl monomer. The polymer having a low dielectric constant and reduced dielectric loss is used as an electrically insulating material in a high frequency band of at least 500 MHz.

6 Claims, 1 Drawing Sheet

LOW DIELECTRIC POLYMER AND FILM, SUBSTRATE AND ELECTRONIC PART USING THE SAME

BACKGROUND OF THE INVENTION

1. Field of the Invention

This invention relates to a low dielectric polymer and a film, substrate and electronic part using the same. More particularly, it relates to a low dielectric polymer which has a low dielectric constant and a low dielectric dissipation factor among electric properties in a high frequency wave band, improved heat resistance up to a high temperature range, close contact or firm adherence to metal foil, and thin film formability. It also relates to a film formed of the low dielectric polymer by itself, a film formed of glass fibers impregnated with the low dielectric polymer, and substrates comprising laminated sections of such film.

2. Prior Art

In accordance with the current outstanding increase of communication information required, there is a strong demand for miniaturization, weight reduction and speed increase of communications equipment. Low dielectric electrically insulating materials are accordingly needed. For portable mobile communications and satellite communications as typified by portable handy phone and cellular phone systems, a high frequency band of mega- to giga-hertz order is used. In response to the rapid development of communications equipment used as communications means, attempts are made to tailor casings, substrates and electronic devices for small size, high density mounting. For accomplishing size and weight reduction of communications equipment adapted for operation in a high frequency band of mega- to giga-hertz order, it is necessary to develop an electrically insulating material having both satisfactory high-frequency transmission characteristics and low dielectric characteristics. More particularly, an energy loss known as a dielectric loss occurs in a device circuit during transmission process. This energy loss is undesirably dissipated within the device circuit as thermal energy. The energy loss occurs in a low frequency region due to vibration caused by a change of a bipolar electric field created by dielectric polarization while the energy loss occurs in a high frequency region due to ionic polarization and electronic polarization. The ratio of the energy consumed in a dielectric material per cycle of an alternating electric field to the energy stored therein is known as a dielectric dissipation factor, which is generally represented by $\tan\delta$. The dielectric loss of a material is proportional to a relative dielectric constant $\epsilon$ multiplied by a dielectric dissipation factor $\tan\delta$. Therefore, in a high frequency region, $\tan\delta$ increases as the frequency increases. Heat release per unit area is increased by high density mounting of electronic devices. In order to reduce the dielectric loss, an insulating material with a reduced $\tan\delta$ must be used. If a low dielectric polymer material having a low dielectric loss is used, then heat release due to dielectric loss and electric resistance is suppressed, resulting in reduced malfunction of signals. For this reason, a material having a low transmission loss or energy loss is strongly desired in the high frequency communications field. The materials proposed thus far as having such electric characteristics including electric insulation and a low dielectric constant include thermoplastic resins such as polyolefins, chlorinated vinyl chloride resins, and fluoro-resins; and thermosetting resins such as unsaturated polyester resins, polyimide resins, epoxy resins, vinyl triazine resins (BT resins), cross-linkable polyphenylene oxide and curable polyphenylene ethers.

These materials, however, have several problems when used in electronic parts or devices as low dielectric constant material. Polyolefins such as polyethylene and polypropylene as disclosed in Japanese Patent Publication (JP-B) No. 31272/1977 are improved in insulation resistance because they have a covalent bond such as carbon-to-carbon bond and are free of a bulky polar group, but inferior in heat resistance. Electric characteristics (such as dielectric loss and dielectric constant) during high-temperature operation are thus aggravated. The polyolefins are thus not suitable as an insulating film or layer in microcapacitors. Additionally, polyethylene and polypropylene are used by once forming a film therefrom, covering an electrically conductive material with the film and joining the film thereto with an adhesive. This process suffers from problems associated with film formation and coverage that working steps are complex and it is difficult to reduce the thickness of film.

Vinyl chloride resins have high insulation resistance, chemical resistance and flame retardancy, but suffer from poor heat resistance and a substantial dielectric loss like the polyolefins.

Chlorinated vinyl chloride resins have improved insulation, chemical resistance and flame retardancy, but suffer from poor heat resistance and a substantial dielectric loss like the polyolefins. Polymers containing fluorine atoms in a molecular chain such as vinylidene fluoride resins, trifluoroethylene resins, and perfluoroethylene resins are improved in electrical properties (including low dielectric constant and low dielectric loss), heat resistance and chemical stability, but suffer from several problems. These fluorinated polymers lack workability and film formability. They are substantially insoluble in commonly used organic solvents and it is thus difficult to form a thin film by solvent casting. They are also difficult to work at elevated temperature to form a configured part or film like thermoplastic resins. Manufacture of devices using these polymers adds to cost. The range of application is limited because of low transparency. Even when a fluorinated polymer can be dissolved in a special solvent to form a polymer solution and the solution be coated to a support for surface treatment, the polymer coating left after evaporation of the solvent will readily peel from the support because of the enhanced water repellent and hydrophobic properties of the polymer. It is then quite difficult to manufacture devices using these polymers. These polymers are thus applicable only in a limited range. Commonly used low dielectric polymers as mentioned above are insufficient in heat resistance since their heat resistance is classified into class B as prescribed in JIS C-4003.

Resins having relatively good heat resistance include thermosetting resins such as epoxy resins, polyphenylene ether (PPE) resins, unsaturated polyester resins, and phenol resins. The epoxy resins satisfy insulation resistance and insulation breakdown strength at heat resistant temperatures as disclosed in JP-A 192392/1994. However, the epoxy resins have a relatively high dielectric constant of at least 3 and are unsatisfactory in this respect. Another drawback of the epoxy resins is lack of thin film formability. It is known that by blending a polyphenylene oxide (PPO) resin with a polyfunctional cyanate resin and another resin and adding a radical polymerization initiator to effect preliminary reaction, there is obtained a curable modified PPO resin composition. The dielectric constant of this composition is not yet reduced to an acceptable level.

As a substitute for less heat resistant epoxy resins, a combination of a phenol-novolak resin and a vinyl triazine resin can be used. A film formed from this combination is substantially low in dynamic properties.

For the purpose of overcoming the above-mentioned problems of, for example, thermal processing, solubility in common organic solvents, and firm adhesion to metal conductors (or layers) such as copper and glass fibers such as woven and non-woven fabrics of fiber glass, there are proposed branched cyclic amorphous fluorinated polymers, copolymers of a perfluoroethylene monomer with another monomer and the like. These polymers satisfy electrical properties including dielectric constant and dielectric loss, but are less heat resistant and insufficiently soluble in organic solvents due to the influence of a methylene chain in the polymer backbone. None of fluoro-polymers available till now have good adhesion to device substrates.

Low-dielectric constant materials having improved dielectric and insulation resistance properties are further required to have sufficient heat resistance to withstand at least a heat treatment of 260° C.×120 sec. because a soldering step is always involved in a device manufacturing process. They must also be improved in chemical stability as typified by acid resistance and alkali resistance, humidity resistance, and mechanical properties. Only a limited number of polymers can satisfy these requirements. These are polyimides, polyether sulfone, polyphenylene sulfide, polysulfone, thermosetting polyphenylene ether (PPE), and polyethylene terephthalate. These polymers have film formability and adhesion to substrates, but are somewhat difficult to handle. For example, an insulating device film is prepared by dissolving the polymer in an organic solvent to form a dilute solution, spin coating the solution, and evaporating the solvent to leave an insulating film. Since those solvents which are good solvents for polyimides and polysulfones such as dimethylacetamide and N-methyl pyrrolidone are polar high-boiling solvents and have a low rate of evaporation so that some solvent may remain in the insulating film. In forming a thin film, it is difficult to control surface smoothness and uniformity. Polyphenylene ether resins and epoxy-modified polyphenylene ether resins are poor in workability and adhesion and lack reliability. Since solutions of these polymers have a relatively high viscosity, it requires skillful control to form a uniform and smooth film.

SUMMARY OF THE INVENTION

A primary object of the present invention is to provide a low dielectric polymer which is improved in close contact or firm adhesion to metal conductor layers and glass fibers, able to form a thin film, and has a low dielectric constant and a low dielectric dissipation factor as well as improved heat resistance, weather resistance, and workability.

Another object of the present invention is to provide a film formed of the low dielectric polymer by itself or formed of glass fibers impregnated with the low dielectric polymer, which film is low dielectric and fully insulating and has improved heat resistance, weather resistance, and workability.

A further object of the present invention is to provide a substrate obtained by laminating sections of the film and featuring low dielectric and insulating properties as well as improved heat resistance, weather resistance, and workability.

A still further object of the present invention is to provide an electronic part prepared using the low dielectric polymer and suitable for operation in a high frequency region.

According to the present invention, there is provided a low dielectric polymer obtained by polymerizing a monomeric composition comprising at least a fumaric acid diester monomer. The low dielectric polymer is typically for use in a high frequency band of at least 500 MHz.

Preferably, the fumaric acid diester is of the following formula (I):

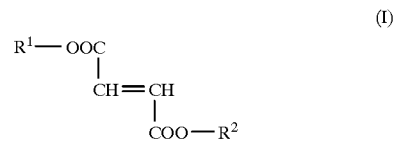

wherein $R^1$ is an alkyl or cycloalkyl group and $R^2$ is an alkyl, cycloalkyl or aryl group, $R^1$ and $R^2$ may be identical or different.

Also preferably, the monomeric composition further contains a vinyl monomer of the following formula (II):

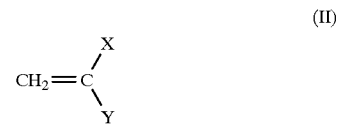

wherein X is a hydrogen atom or methyl group and Y is a fluorine atom, chlorine atom, alkyl group, alkenyl group, aryl group, ether group, acyl group or ester group.

In another aspect, the present invention provides a film comprising the low dielectric polymer defined above. The film has a thickness of at least 1 μm. A substrate comprising laminated sections of the film is also contemplated.

In a further aspect, the present invention provides a film comprising glass fibers impregnated with the low dielectric polymer defined above. The film has a thickness of at least 30 μm. A substrate comprising laminated sections of the film is also contemplated.

The film of the polymer by itself or the polymer-impregnated fiber glass is typically for use in a high frequency band of at least 500 MHz. The substrate is also for use in a high frequency band of at least 500 MHz.

In a still further aspect, the present invention provides an electronic part for use in a high frequency band of at least 500 MHz comprising the low dielectric polymer defined above.

BRIEF DESCRIPTION OF THE DRAWINGS

These and further features of the present invention will be apparent with reference to the following description and drawings, wherein.

DESCRIPTION OF THE PREFERRED EMBODIMENTS

Figure 1:
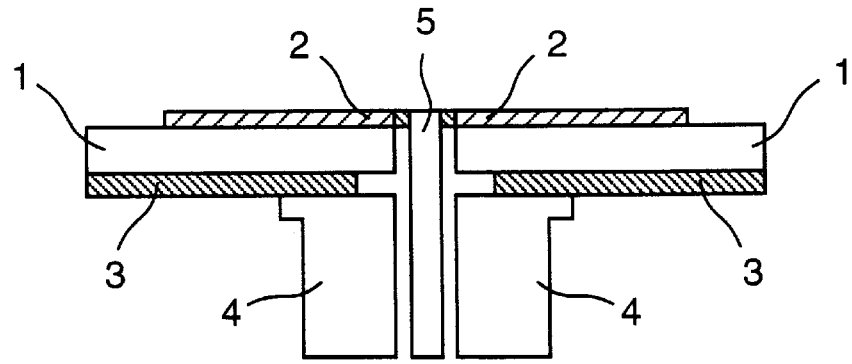
FIG. 1 is a schematic cross-sectional view of a patch antenna as one example of the electronic part according to the invention.

According to the invention, a low dielectric polymer is obtained by polymerizing a monomeric composition comprising a fumaric acid diester monomer. Differently stated, the invention provides a fumarate polymer having recurring units derived from a fumaric acid diester.

The fumaric acid diester monomer used herein is not critical insofar as it can form a polymer having low dielectric properties and heat resistance. The fumaric acid diester monomer is preferably of the following formula (I):

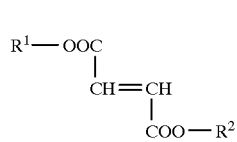

wherein $R^1$ is an alkyl or cycloalkyl group and $R^2$ is an alkyl, cycloalkyl or aryl group, $R^1$ and $R^2$ may be identical or different.

More particularly, the alkyl groups represented by each of $R^1$ and $R^2$ preferably have 2 to 12 carbon atoms in total, and may be either linear or branched and have a substituent. For substituted alkyl groups, exemplary substituents include halogen atoms such as F and Cl, alkoxy groups such as methoxy, ethoxy, propoxy and butoxy groups, and aryl groups such as phenyl. Examples of the alkyl group represented by $R^1$ and $R^2$ include ethyl, n-propyl, isopropyl, n-butyl, sec-butyl, tert-butyl, n-pentyl (or n-amyl), sec-amyl, isopentyl, neopentyl, tert-pentyl, n-hexyl, 4-methyl-2-pentyl, heptyl, octyl, nonyl, decyl, undecyl, and dodecyl groups; trifluoroethyl, hexafluoroisopropyl, perfluoroisopropyl, perfluorobutylethyl, perfluorooctylethyl, and 2-chloroethyl groups; 1-butoxy-2-propyl and methoxyethyl groups; and benzyl group.

The cycloalkyl groups represented by each of $R^1$ and $R^2$ preferably have 3 to 14 carbon atoms in total, and may have either a single ring or a bridged ring and have a substituent. For substituted cycloalkyl groups, exemplary substituents are the same as exemplified for the substituted alkyl groups while alkyl groups (for example, linear or branched alkyl groups of 1 to 14 carbon atoms, typically methyl) are also useful substituents. Examples of the cycloalkyl group represented by $R^1$ and $R^2$ include cyclopentyl, cyclohexyl, adamantyl, and dimethyladamantyl groups.

The aryl groups represented by $R^2$ preferably have 6 to 18 carbon atoms in total. Monocyclic aryl groups are preferred although polycyclic ones (having condensed rings and individual rings) are acceptable. The aryl groups may have a substituent which is the same as exemplified for the alkyl and cycloalkyl groups. Phenyl is typical of the aryl group represented by $R^2$.

Preferably, each of $R^1$ and $R^2$ is an alkyl or cycloalkyl group. The preferred alkyl groups are branched alkyl groups such as isopropyl, sec-butyl and tert-butyl groups. Cyclohexyl is the preferred cycloalkyl group.

Preferred examples of the fumaric acid diester monomer of formula (I) include:
  dialkyl fumarates such as diethyl fumarate, di-n-propyl fumarate, di-n-hexyl fumarate, isopropyl n-hexyl fumarate, diisopropyl fumarate, di-n-butyl fumarate, di-sec-butyl fumarate, di-tert-butyl fumarate, di-sec-amyl fumarate, n-butyl isopropyl fumarate, isopropyl sec-butyl fumarate, tert-butyl 4-methyl-2-pentyl fumarate, isopropyl tert-butyl fumarate, isopropyl sec-amyl fumarate, di-4-methyl-2-pentyl fumarate, diisoamyl fumarate, di-4-methyl-2-hexyl fumarate, and tert-butyl isoamyl fumarate;
  dicycloalkyl fumarates such as dicyclopentyl fumarate, dicyclohexyl fumarate, dicycloheptyl fumarate, cyclopentylcyclohexyl fumarate, bis(dimethyladamantyl) fumarate, and bis(adamantyl) fumarate;
  alkyl cycloalkyl fumarates such as isopropyl cyclohexyl fumarate, isopropyl dimethyladamantyl fumarate, isopropyl adamantyl fumarate, and tert-butyl cyclohexyl fumarate;
  alkyl aryl fumarates such as isopropyl phenyl fumarate;
  alkyl aralkyl fumarates such as tert-butyl benzyl fumarate and isopropyl benzyl fumarate;
  di-fluoroalkyl fumarates such as ditrifluoroethyl fumarate, dihexafluoroisopropyl fumarate, diperfluoroisopropyl fumarate, and bis(perfluorobutylethyl) fumarate;
  alkyl fluoroalkyl fumarates such as isopropyl perfluorooctylethyl fumarate and isopropyl hexafluoroisopropyl fumarate; and
  other substituted alkyl alkyl fumarates such as 1-butoxy-2-propyl tert-butyl fumarate, methoxyethyl isopropyl fumarate, and 2-chloroethyl isopropyl fumarate.

Especially preferred among others are diisopropyl fumarate, dicyclohexyl fumarate, di-sec-butyl fumarate, ditert-butyl fumarate, isopropyl tert-butyl fumarate, n-butyl isopropyl fumarate, and n-hexyl isopropyl fumarate.

These diesters can be synthesized by combining conventional esterification and isomerization techniques.

In preparing a fumarate polymer according to the invention, the fumaric acid diesters or fumarates mentioned above may be used alone or in admixture of two or more. Accordingly, the fumarate polymer according to the invention may be either a homopolymer obtained by polymerizing a single fumaric acid diester or a copolymer obtained by polymerizing two or more fumaric acid diesters. The copolymers may be random, alternating or block copolymers.

The fumarate polymer according to the invention may be one obtained using only a fumaric acid diester as a monomer as mentioned above although monomers other than the fumaric acid diester may be used in polymerization. That is, copolymers of the fumaric acid diester with another monomer or monomers are also acceptable. The other monomer is typically a vinyl monomer. The vinyl monomer used herein as a co-monomer is not critical insofar as it is copolymerizable with the fumarate and imparts moldability, film formability and mechanical strength. Preferred are vinyl monomers of the following general formula (II):

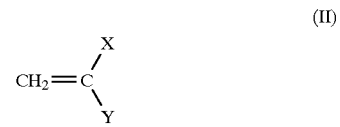

wherein X is a hydrogen atom or methyl group and Y is selected from the class consisting of a fluorine atom, chlorine atom, alkyl group, alkenyl group, aryl group, ether group, acyl group, and ester group.

More particularly, the alkyl group represented by Y preferably has 1 to 14 carbon atoms in total, and may be either linear or branched.

The alkenyl group represented by Y preferably has 2 to 14 carbon atoms in total, and may be either linear or branched. For substituted alkenyl groups, exemplary substituents are vinyl, allyl, propenyl and butenyl groups.

The aryl group represented by Y preferably has 6 to 18 carbon atoms in total, and may be either monocyclic or polycyclic such as a condensed ring. The aryl group may have a substituent, for example, halogen atoms such as F and Cl and alkyl groups such as methyl. Exemplary of the aryl group are phenyl, α-naphthyl, β-naphthyl, o-, m- and p-tolyl, o-, m- and p-chlorophenyl groups.

The ether group represented by Y is —$OR^3$ wherein $R^3$ is an alkyl or aryl group. The alkyl group represented by $R^3$ preferably has 1 to 8 carbon atoms in total, and may be either linear or branched and have a substituent such as halogen atoms. The aryl group represented by $R^3$ preferably has 6 to 18 carbon atoms in total and may be either monocyclic (preferred) or polycyclic such as a condensed ring. Examples of the ether group represented by Y include methoxy, ethoxy, propoxy, butoxy, isobutoxy, and phenoxy groups.

The acyl group represented by Y is —$COR^4$ wherein $R^4$ is an alkyl or aryl group. The alkyl group represented by $R^4$ preferably has 1 to 8 carbon atoms in total, and may be either linear or branched and have a substituent such as halogen atoms. The aryl group represented by $R^4$ preferably has 6 to 18 carbon atoms in total and may be either monocyclic (preferred) or polycyclic such as a condensed ring. Examples of the acyl group represented by Y include acetyl, propionyl, butyryl, isobutyryl, and benzoyl groups.

The ester group represented by Y is —$OCOR^5$ or —$COOR^5$ wherein $R^5$ is an alkyl or aryl group. The alkyl group represented by $R^5$ preferably has 1 to 20 carbon atoms in total, and may be either linear or branched and have a substituent such as halogen atoms. The aryl group represented by $R^5$ preferably has 6 to 18 carbon atoms in total and may be either monocyclic (preferred) or polycyclic such as a condensed ring. Examples of the ester group represented by Y include acetoxy, propionyloxy, butyryloxy, isobutyryloxy, valeryloxy, isovaleryloxy, —$OCOC_4H_9$(-sec), —$OCOC_4H_9$ (-tert), —$OCOC$ $(CH_3)_2CH_2CH_3$, —$OCOC$ $(CH_3)_2CH_2CH_2CH_3$, stearoyloxy, benzoyloxy, tert-butylbenzoyloxy, methoxycarbonyl, ethoxycarbonyl, butoxycarbonyl, 2-ethylhexyloxycarbonyl, and phenoxycarbonyl groups.

The copolymerizable component used herein is a vinyl comonomer based on an olefinic hydrocarbon as mentioned above. Examples of the vinyl monomer of formula (II) are well-known radical polymerizable monomers including vinyl carboxylates such as vinyl acetate, vinyl pivalate, vinyl 2,2-dimethylbutyrate, vinyl 2,2-dimethylpentanoate, vinyl 2-methyl-2-butyrate, vinyl propionate, vinyl stearate, and vinyl 2-ethyl-2-methylbutyrate;

aromatic vinyl monomers such as vinyl p-tert-butylbenzoate, vinyl N,N-dimethylaminobenzoate, and vinyl benzoate;

styrene, o-, m- and p-chloromethylstyrene, and α-substituted styrene derivatives such as α-methylstyrene and substituted aromatic ring styrene derivatives;

alkyl-substituted aromatic ring styrenes such as o-, m- and p-methylstyrene;

α-olefins such as vinyl chloride and vinyl fluoride;

halogen-substituted aromatic ring styrenes such as o-, m- and p-halogenated styrene, typically p-chlorostyrene;

vinyl ethers such as ethyl vinyl ether, vinyl butyl ether and isobutyl vinyl ether;

naphthalene derivatives such as α- and β-vinylnaphthalene;

alkyl vinyl ketones such as methyl vinyl ketone and isobutyl vinyl ketone;

dienes such as butadiene and isoprene; and (meth)acrylates such as methyl (meth)acrylate, ethyl (meth)acrylate, butyl (meth)acrylate, 2-ethylhexyl (meth)acrylate, and phenyl (meth)acrylate.

Such a vinyl monomer may be readily prepared by effecting ester exchange reaction between vinyl acetate and a corresponding organic acid in the presence of mercury acetate or sulfuric acid or in the presence of another catalyst, for example, metal complexes such as platinum and rhodium complexes.

The above-mentioned vinyl monomers may be used as a co-monomer alone or in admixture of two or more.

The fumarate polymer having recurring units derived from such a vinyl monomer within the scope of the invention is a copolymer which may be a random, alternating or block copolymer.

The polymers having recurring units derived from a fumaric acid diester within the scope of the invention are low dielectric and improved in film formability, film adherence, and mechanical properties. As mentioned above, the polymers may be any of a homopolymer of a single fumaric acid diester, a copolymer of different fumaric acid diesters, and a copolymer of a fumaric acid diester with a copolymerizable vinyl monomer.

No particular limit is imposed on the molecular weight of the fumarate polymer. In one application wherein an electrically insulating film is formed from the fumarate polymer and an electrically insulating substrate is further formed by stacking plural sections of the film, the insulating film and substrate must have sufficient mechanical strength to withstand considerable stresses developed during manufacture of electronic parts. With such an application taken into account, the fumarate polymer should desirably have a higher molecular weight, specifically a number average molecular weight of about 10,000 to 1,500,000. Polymers with a lower molecular weight would be poor in mechanical strength, chemical stability and heat resistance. For film formation, film adherence to a support, and elimination of film defects, a relatively higher molecular weight is desirable. However, a polymer with an extremely high molecular weight would be inefficient to work or process because formation of a uniform smooth film would be inhibited.

The polymer of the invention is obtained by polymerizing a monomeric composition containing only a fumaric acid diester (as defined above) as a monomer or a monomeric composition further containing a vinyl monomer (as defined above) as an additional monomer. Preferably the fumaric acid diester occupies at least 50% by weight, more preferably at least 60% by weight, most preferably at least 80% by weight of the entire monomers (monomer feed). A less content of the fumaric acid diester would result in insufficient electrical properties (dielectric constant and dielectric dissipation factor) and heat resistance. On the other hand, the proportion of the vinyl monomer in the entire monomer stock is preferably 0 to 50% by weight, more preferably 0 to 40% by weight, most preferably 0 to 20% by weight from the standpoints of low dielectric properties (low dielectric constant and low dielectric dissipation factor), formability, workability, solution viscosity, film adherence, and mechanical properties.

As a consequence, the fumarate polymer should preferably contain at least 50%, more preferably at least 60%, most preferably at least 80% by weight of a component originating from the fumaric acid diester.

The fumarate polymer according to the invention has a softening temperature of at least 200° C., typically in the range of 230 to 350° C. Such a high softening temperature indicates sufficient heat resistance in the soldering step essentially involved in a device manufacturing process. The reason why the fumarate polymer has such a high softening temperature is that the polymer's backbone structure is free of a methylene group and a substituent is attached to carbon in the backbone to restrain molecular chain thermal mobility of the backbone.

The fumarate polymer according to the invention is a rigid polymer having a rod structure. Then the polymer is unsusceptible to attack to side chain links and improved in heat resistance and acid and alkali resistance (etching resistance).

Preferred examples of the fumarate polymer are given below. For convenience of description, a polymer is represented by its starting monomer or monomers.

I) Di-alkyl fumarate polymers
I-1: diisopropyl fumarate
I-2: dicyclohexyl fumarate
I-3: di-sec-butyl fumarate
I-4: di-tert-butyl fumarate
I-5: tert-butyl isopropyl fumarate
I-6: diisopropyl fumarate/di-sec-butyl fumarate
I-7: tert-butyl isopropyl fumarate/diisopropyl fumarate
I-8: diisopropyl fumarate/dicyclohexyl fumarate
I-9: diisopropyl fumarate/n-butyl isopropyl fumarate
I-10: diisopropyl fumarate/n-hexyl isopropyl fumarate
I-11: dicyclohexyl fumarate/n-butyl isopropyl fumarate
I-12: dicyclohexyl fumarate/di-sec-butyl fumarate II) Di-alkyl fumarate/vinyl polymers
II-1: diisopropyl fumarate/styrene
II-2: di-sec-butyl fumarate/vinyl tert-butylbenzoate
II-3: dicyclohexyl fumarate/vinyl 2-ethyl-2-methylbutyrate
II-4: diisopropyl fumarate/vinyl tert-butylbenzoate
II-5: diisopropyl fumarate/vinyl p-N,N-dimethylaminobenzoate
II-6: dicyclohexyl fumarate/vinyl tert-butylbenzoate
II-7: cyclohexyl isopropyl fumarate/vinyl acetate
II-8: di-tert-butyl fumarate/dicyclohexyl fumarate/vinyl tert-butylbenzoate
II-9: diisopropyl fumarate/dicyclohexyl fumarate/vinyl 2-ethyl-2-methylbutyrate
II-10: diisopropyl fumarate/di-sec-butyl fumarate/vinyl N,N-dimethylaminobenzoate
II-11: di-sec-butyl fumarate/dicyclohexyl fumarate/vinyl tert-butylbenzoate
II-12: dicyclohexyl fumarate/diisopropyl fumarate/styrene In the practice of the invention, the fumarate polymer is preferably prepared by a conventional radical polymerization process. The initiator which can be used for polymerization is selected from organic peroxides and azo-compounds both having a 10-hour half-life temperature of up to 80° C., alone or in admixture of two or more when it is desired to increase the molecular weight. Examples of the polymerization initiator include organic peroxides such as benzoyl peroxide, diisopropyl peroxydicarbonate, tert-butyl peroxydi-2-ethylhexanoate, tert-butyl peroxydiisobutyrate, cumene peroxide, tert-butyl hydroperoxide, tert-butyl peroxypivalate, and lauroyldiacyl peroxide; and azo-compounds such as 2,2'-azobisisobutyronitrile, 2,2'-azobis (2-methylbutyronitrile), azobis(2,4-dimethylvaleronitrile), 1,1'-azobis(cyclohexane-1-carbonitrile), dimethyl 2,2'-azobis(isobutyrate), 2,2'-azobis(2,4-dimethylvaleronitrile), and tert-butylperoxyisopropyl carbonate. The polymerization initiator is preferably used in an amount of up to 10 parts, more preferably up to 5 parts by weight per 100 parts by weight of the monomer(s).

With respect to the conditions under which a monomer is polymerized or monomers are copolymerized by such a process, the polymerization system is preferably kept in an inert gas atmosphere such as nitrogen, carbon dioxide, helium, and argon or under deaerated conditions. The polymerizing or copolymerizing temperature is preferably in the range of 30 to 120° C. although it varies with a particular type of polymerization initiator used. The overall time taken for polymerization is desirably about 10 to 72 hours. It is also possible to effect polymerization with additives such as pigments and UV stabilizers added to the monomer or monomers.

As to the radical polymerization process mentioned above, a choice may be made among various techniques used for radical polymerization of common vinyl monomers such as solution polymerization, bulk polymerization, emulsion polymerization, suspension polymerization, and radiation polymerization. For low dielectric electrically insulating substrates adapted for operation in a high frequency band according to the invention, it is a key to minimize a dielectric loss tangent or dielectric dissipation factor. Since the presence of a low molecular weight fraction in a polymeric material can induce external plasticization to increase a dielectric loss tangent to exacerbate dielectric characteristics in a high frequency band, it is important to employ such a polymerization technique that the resulting fumarate polymer or copolymer may have a very high molecular weight. Bulk polymerization and suspension polymerization techniques are most desirable since they allow the monomer (s) to be charged in a high concentration, for example, a fumaric acid diester and a vinyl monomer, which are monomers to be charged for copolymerization, to be charged in a high concentration. Since the molecular weight of a polymer or copolymer decreases as the polymerization temperature rises, it is preferable to effect radical polymerization or copolymerization at relatively low temperatures of 0° C. to 60° C.

Fumarate polymers according to the invention can be identified by nuclear magnetic resonance (NMR) spectroscopy and infrared (IR) absorption spectroscopy.

A variety of groups may be introduced as a terminal group in accordance with the intended application.

The fumarate polymer according to the invention can be used in various forms, for example, as a film of itself such as coating, a film of glass fibers impregnated with the fumarate polymer, and in bulk form, molded part form and film lamination form. Therefore, the fumarate polymer according to the invention can be used as substrates for high-frequency electronic devices and electronic parts (e.g., resonators, filters, capacitors, inductors, and antennas), supports for filters as chip parts (e.g., capacitive filters in the form of a multi-layer substrate), resonators (e.g., tri-plate type resonators) and dielectric resonators, various substrates, housings and casings (e.g., antenna rod housings) of electronic parts, and coatings on electronic parts or housings and casings thereof.

As the substrate, the fumarate polymer is expected to be a substitute for conventional glass fiber reinforced epoxy resin substrates, for example, part mounting onboard substrates and copper clad laminates. It is also useful in circuit-built-in substrates and antenna substrates (patch antenna substrates). It may be used in CPU onboard substrates for operation at 100 MHz and 130 MHz although heat dissipating means must be provided.

When used for coating purposes, the fumarate polymer may be a surface passivating material for IC substrates and a moisture-proof material for hybrid IC substrates (e.g., alumina substrates). It has a passivation function when used as undercoat, backcoat or topcoat. Furthermore it may be a matrix of coating material and a capacitor forming printing material.

A film can be formed from the low dielectric polymer derived from a fumaric acid diester according to the invention by dissolving the polymer in a solvent to form a homogeneous solution, casting the solution and evaporating the solvent. There is obtained a uniform film of at least 1 $\mu$m thick. By such a casting technique, a film can be formed to any desired thickness suitable for the intended application. The upper limit of thickness is not critical although it is generally about 5 to 10 mm. In forming a film by a casting technique, the support may be a glass plate, silicone rubber plate or metal plate. The film is obtained by evaporating off the solvent at room temperature (about 15 to 30° C.) as mentioned above although drying may be done at a temperature of about 40 to 60° C. if necessary. An electrically insulating film is obtained in this way.

A substrate of a predetermined thickness is prepared from the above-mentioned film by placing sections of the film with some solvent left therein one on top of another until the predetermined thickness is reached, and heating the stack in a drying oven at 40 to 200° C. for ½ to 8 hours for removing the solvent, yielding a substrate having the predetermined thickness and strength. The stack may be pressed under pressure if desired. An electrically insulating substrate is obtained in this way.

A multilayer substrate is prepared from the above-mentioned electrically insulating film by alternately placing sections of the insulating film and metallic conductor layers in the form of sections of metallic conductor film of copper or the like and/or placing a metallic conductor layer as outermost layers on stacked film sections. Also in this embodiment, by alternately stacking sections of the insulating film with some solvent left therein and metallic conductor layers and thereafter removing the solvent as in the above embodiment, a multilayer substrate wherein the insulating film sections are firmly bonded to the metallic conductor layers is obtained.

Where it is desired to form a patterned metallic conductor layer, the metallic conductor film may be patterned to a predetermined shape and then placed close to sections of insulating film before solvent removal. It is noted that where metallic conductor film sections and insulating film sections are closely bonded by lamination and solvent removal, the metallic conductor layer becoming the outermost layer may be either patterned and then closely bonded or closely bonded and then patterned by etching.

The metallic conductor layers may be formed by vacuum evaporation.

It is also possible to adhesively attach a metallic conductor film to an insulating film from which the solvent has been removed. When patterning is necessary, the metallic conductor film may be patterned either before or after the adhesive attachment.

Examples of the solvent in which the fumarate polymer can be dissolved include aromatic hydrocarbon solvents such as benzene and toluene; ketone solvents such as methyl ethyl ketone, methyl isobutyl ketone, and cyclohexanone; and tetrahydrofuran (THF), chloroform, dimethylformamide, dimethyl sulfoxide, butyl chloride, ethyl acetate, decalin, trichlorotrifluoroethane, and trifluorotoluene. The solution may contain the fumarate polymer in any desired concentration although the preferred fumarate polymer concentration ranges from 5% to 30% by weight. A fumarate polymer solution having a polymer concentration of more than 30% by weight is too viscous and difficult to work with. The fumarate polymer solution should preferably have a viscosity of about 200 to 800 centipoise under normal conditions.

In the practice of the invention, a solution of the fumarate polymer may be coated on a resin film support of polyethylene terephthalate (PET) or the like to thereby form a film of the fumarate polymer. The coating may have a thickness of 1 $\mu$m or more. A coating having a thickness of up to about 500 $\mu$m can be formed by controlling the concentration of the coating solution. The PET support used herein may have a conductive layer of ITO formed on its surface.

Any of well-known coating techniques including doctor blade coating, spin coating, dipping and screen printing techniques may be used. A coating solution as described above may be used.

When a coating is formed in this way to a thickness of about 100 $\mu$m, for example, there are found no defects with a size of more than 0.05 $\mu$m. That is, a coating of quality having an extremely smooth surface can be formed.

Such coatings may be laminated together with their film supports. Lamination may be done by stacking coatings with some solvent left therein followed by heating for solvent removal or by drying coatings and adhesively bonding the dry coatings. If necessary, metallic conductor layers may be formed as previously mentioned.

In another embodiment of the invention, a film of fumarate polymer-impregnated fiber glass can be formed by impregnating fiber glass with a solution of the fumarate polymer according to the invention followed by solvent removal. This fiber glass film has a thickness of from 30 $\mu$m to about 500 $\mu$m, practically from 35 $\mu$m to about 500 $\mu$m. The film ensures improved adhesion at the interface between the fiber glass and the polymer. Solvent removal may be done as previously mentioned.

Also as in the previous embodiment, a substrate may be prepared by laminating sections of a film of fumarate polymer-impregnated fiber glass with some solvent left therein, followed by solvent removal. If necessary, sections of metallic conductor film may be laminated. This lamination may be done as previously mentioned.

A substrate may also be prepared by stacking film sections with some solvent left therein followed by solvent removal. If necessary, metallic conductor film sections may be laminated. This lamination may be done as previously mentioned.

The solvent which is used to form a polymer solution for impregnation of glass fibers must be the one in which the low dielectric polymer is well soluble. When control of an evaporation rate is taken into account, a poor solvent may be combined with the solvent in such a limited amount as to have no deleterious influence. Examples of the solvent include ketone solvents such as methyl ethyl ketone, methyl isobutyl ketone, cyclohexanone, and acetone; aromatic hydrocarbon solvents such as benzene and toluene; various glycol ether solvents such as methyl cellosolve, butyl cellosolve, diethylene glycol monomethyl ether, propylene glycol monomethyl ether, dipropylene glycol monomethyl ether, and diethylene glycol monobutyl ether; ester solvents such as butyl cellosolve acetate, methyl cellosolve acetate, and ethyr acetate; amide solvents such as N,N-dimethylacetamide, N,N-dimethylformamide, and N-methyl-2-pyrrolidone; alcohol solvents such as methanol and ethanol; and tetrahydrofuran (THF), decalin, dimethyl sulfoxide, butyl chloride, trichlorotrifluoroethane, and trifluorotoluene. A mixture of such solvents is also useful.

Preferably the impregnating solution contains the fumarate polymer in a concentration of 5 to 30% by weight for ease of application. Then the solution has a viscosity of about 200 to 800 centipoise under normal conditions.

In the above-mentioned embodiment, any of insulating fibers used in the manufacture of conventional rigid substrates as reinforcing fibers may be used instead of glass fibers. However, glass fibers are preferred, with glass fibers having low dielectric characteristics (low dielectric constant and low dielectric dissipation factor) being especially preferred. Glass fibers may be used in the form of woven fabric or non-woven fabric.

The glass fiber-containing film should preferably have a polymer content of 10 to 70% by weight. Within this polymer content range, a film or substrate having sufficient strength, low dielectric characteristics and heat resistance is obtained. It is acceptable that such a polymer content be eventually achieved by applying a polymer solution, typically having a polymer concentration of 5 to 20% by weight, as a resin glue when film sections are laminated or the resultant substrate is laminated.

The term "film with some solvent left therein" means that the film has a residual solvent content of at least 3% by weight, especially 5 to 15% by weight.

In the practice of the invention, any of well-known additives, for example, flame retardants and coupling agents may be contained in the film or substrate prepared as mentioned above.

In a further embodiment of the invention, the polymer of the invention may be used by forming it into a predetermined shape. The polymer may be formed into a film by a casting method as mentioned above. The polymer may also be formed into a rod, rectangular column and cylinder shape by a casting method. The fumarate polymer solution may be cast under pressure if necessary. Other useful forming methods include molding, compression, and extrusion methods. Formation may be done according to a well-known procedure by preparing a solution, paste or patty containing the fumarate polymer according to the invention and introducing it into a mold.

BENEFITS OF THE INVENTION

According to the invention, a low dielectric polymer is obtained by effecting radical polymerization or copolymerization of a monomer of specific unsaturated dibasic acid diester alone or in admixture with a vinyl monomer using an organic peroxide or azo-compound as a polymerization initiator. When the polymer is used as an electrically insulating film or an electrically insulating substrate comprising laminated sections of the film, the insulating film or substrate has consistent physical properties because the polymer is free from a metal compound which is conventionally used as a polymerization initiator and deleterious to electric performance (the process omits any step that allows such a metal compound to enter a polymer being formed). An electrically insulating film can be readily and simply formed from the low dielectric polymer simply by dissolving the polymer in an organic solvent, applying the resulting solution, and removing the solvent from the coating. This film ensures improved adhesion to metal conductors. A glass fiber-containing electrically insulating film can be prepared from the low dielectric polymer simply by dissolving the polymer in an organic solvent, impregnating glass fibers with the resulting solution, and removing the solvent, that is, without a need for adhesive. This fiber-containing film ensures improved adhesion between the fiber glass and the polymer at their interface.

With respect to the electric performance of a low dielectric polymer according to the invention, the polymer is characterized by a dielectric constant ($\epsilon$) of at least 1, especially 1.8 to 3.0 and a dielectric dissipation factor (tan$\delta$) of up to 0.01, especially 0.001 to 0.01 in a frequency band of at least 500 MHz, especially in a high frequency band of 500 MHz to 10 GHz. When the polymer takes the form of a glass fiber-containing electrically insulating substrate constituting an electric element, the substrate is improved in strength and further reduced in dielectric dissipation factor from an electrically insulating substrate of the low dielectric polymer by itself.

With respect to the insulation resistance of the polymer according to the invention, it has a volume resistivity of more than about 2 to $5 \times 10^{14}$ $\Omega$cm under normal conditions. Its breakdown strength is as high as 40 kV/mm or more, especially 44 to 90 kV/mm.

The polymer of the invention is heat resistant enough to withstand the elevated temperature encountered during soldering.

The polymer of the invention is resistant to strong acid and alkali, resistant to weather, and free from discoloration by UV radiation.

Therefore, the polymer of the invention is applicable to electric elements and electrically insulating substrates which are incorporated in compact information devices such as electronic devices and communication devices required to operate in a high frequency band of at least 500 MHz, especially 500 MHz to 10 GHz. This makes a great contribution to the electronic industry. The present invention provides a low dielectric polymer for operation in a high-frequency band, possessing adhesion to metal foil and fiber glass, workability and thin film forming ability as well as an electrically insulating substrate using that polymer.

Since the polymer of the invention is characterized by a low dielectric constant, low dielectric dissipation factor and improved transparency, it is also applicable to electronic parts other than the above-mentioned.

EXAMPLE

Examples of the present invention are given below by way of illustration and not by way of limitation. All parts are by weight.

First, synthesis of exemplary fumarate polymers is described.

Synthesis Example 1

A glass ampule was charged with 10 parts of diisopropyl fumarate (di-iPF), 0.1 part of azobisisobutyronitrile (AIBN) as a radical polymerization initiator, and 1 part of pure benzene. The ampule was thoroughly purged with nitrogen and repeatedly evacuated and deaerated before it was sealed in vacuum. The ampule was then placed in a shaking constant temperature bath at 40° C. where radical polymerization was effected for 72 hours. At the end of polymerization, benzene was introduced into the ampule and the contents were poured into a large volume of methanol, allowing a polymer to precipitate. The polymer was isolated, repeatedly reprecipitated from a benzene-methanol system, and dried in vacuum, obtaining an end polymer of di-iPF.

Synthesis Example 2

The procedure of Synthesis Example 1 was repeated except that dicyclohexyl fumarate (di-cHF) was used instead of di-iPF, obtaining a polymer of di-cHF.

Synthesis Example 3

The procedure of Synthesis Example 1 was repeated except that di-sec-butyl fumarate (di-sBF) was used instead of di-iPF, obtaining a polymer of di-sBF.

Synthesis Example 4

The procedure of Synthesis Example 1 was repeated except that di-tert-butyl fumarate (di-tBF) was used instead of di-iPF, obtaining a polymer of di-tBF.

Synthesis Example 5

The procedure of Synthesis Example 1 was repeated except that tert-butyl isopropyl fumarate (tB-iPF) was used instead of di-iPF, obtaining a polymer of tB-iPF.

Synthesis Example 6

The procedure of Synthesis Example 1 was repeated except that there were used 7 parts of di-iPF, 3 parts of di-sBF, and di-n-propylperoxy dicarbonate (Perloyl® NPP commercially available from NOF Corp.) as a radical polymerization initiator, obtaining a copolymer of di-iPF/di-sBF.

Synthesis Example 7

The procedure of Synthesis Example 6 was repeated except that the glass ampule was charged with 8 parts of tert-butyl isopropyl fumarate (tB-iPF) and 2 parts of di-iPF, 0.01 part of diisopropylperoxy dicarbonate (Perloyl® IPP commercially available from NOF Corp.) as a radical polymerization initiator, and 0.5 part of pure benzene, obtaining a copolymer of tB-iPF/di-iPF.

Synthesis Example 8

A glass ampule was charged with 5 parts of di-iPF and 5 parts of di-cHF, and 0.03 part of Perloyl NPP was added thereto as a radical polymerization initiator. The ampule was repeatedly purged with nitrogen and evacuated/deaerated for thorough nitrogen purging before it was sealed in vacuum. The ampule was then placed in a constant temperature bath at 50° C. where bulk polymerization was effected for 72 hours. The subsequent steps were as in Synthesis Example 6. There was obtained a copolymer of di-iPF/di-cHF.

Synthesis Example 9

The procedure of Synthesis Example 6 was repeated except that 8 parts of di-iPF and 2 parts of n-butyl isopropyl fumarate (nBu-iPF) were used, obtaining a copolymer of di-iPF/nBu-iPF.

Synthesis Example 10

The procedure of Synthesis Example 6 was repeated except that 7 parts of di-iPF and 3 parts of n-hexyl isopropyl fumarate (nHex-iPF) were used, obtaining a copolymer of di-iPF/nHex-iPF.

Synthesis Example 11

The procedure of Synthesis Example 6 was repeated except that 5 parts of di-cHF and 5 parts of nBu-iPF were used, obtaining a copolymer of di-cHF/nBu-iPF.

Synthesis Example 12

A glass ampule was charged with 8 parts of di-iPF, 2 parts of styrene (St), and 0.01 part of Perloyl IPP was added thereto as a radical polymerization initiator. The ampule was repeatedly purged with nitrogen and evacuated/deaerated for thorough nitrogen purging before it was sealed in vacuum. The ampule was then placed in a constant temperature bath at 30° C. where bulk polymerization was effected for 72 hours. The subsequent steps were as in Synthesis Example 6. There was obtained a copolymer of di-iPF/St.

Synthesis Example 13

A glass ampule was charged with 8 parts of di-sBF, 2 parts of tert-butylvinyl benzoate (or vinyl p-tertbutylbenzoate (VtBB)), 0.01 part of Perloyl IPP as a radical polymerization initiator, and 8 parts of pure benzene. The ampule was thoroughly purged with nitrogen and repeatedly evacuated and deaerated before it was sealed in vacuum. The ampule was then placed in a shaking constant temperature bath at 40° C. where radical polymerization was effected for 72 hours. The subsequent steps were as in Synthesis Example 6. There was obtained a copolymer of di-sBF/VtBB.

Synthesis Example 14

The procedure of Synthesis Example 6 was repeated except that 7 parts of di-cHF and 3 parts of vinyl 2-ethyl-2-methylbutanoate (VEMB) were used, obtaining a copolymer of di-cHF/VEMB.

Synthesis Example 15

The procedure of Synthesis Example 6 was repeated except that 8 parts of di-iPF and 2 parts of VtBB were used, obtaining a copolymer of di-iPF/VtBB.

Synthesis Example 16

The procedure of Synthesis Example 6 was repeated except that 6 parts of di-iPF and 4 parts of vinyl p-N,N-dimethylaminobenzoate (VDMAB) were used, obtaining a copolymer of di-iPF/VDMAB.

Synthesis Example 17

The procedure of Synthesis Example 6 was repeated except that 7 parts of di-cHF and 3 parts of VtBB were used, obtaining a copolymer of di-cHF/VtBB.

Synthesis Example 18

The procedure of Synthesis Example 6 was repeated except that 8 parts of cyclohexyl isopropyl fumarate (cH-iPF) and 2 parts of vinyl acetate (VAc) were used, obtaining a copolymer of cH-iBF/VAc.

Synthesis Example 19

A glass ampule was charged with 4 parts of di-tBF, 5 parts of di-cHF, 1 part of VtBB, 0.01 part of Perloyl NPP as a radical polymerization initiator, and 2 parts of pure benzene. The ampule was thoroughly purged with nitrogen and repeatedly evacuated and deaerated before it was sealed in vacuum. The ampule was then placed in a shaking constant temperature bath at 40° C. where radical polymerization was effected for 72 hours. The subsequent steps were as in Synthesis Example 1. There was obtained a copolymer of di-tBF/di-cHF/VtBB.

Synthesis Example 20

The procedure of Synthesis Example 19 was repeated except that the glass ampule was charged with 4.5 parts of di-iPF, 4.5 parts of di-cHF, and 1 part of VEMB and 0.01 part of dimethyl azobisisobutyrate (MAIB) was added as a radical polymerization initiator, obtaining a copolymer of di-iPF/di-cHF/VEMB.

Synthesis Example 21

The procedure of Synthesis Example 19 was repeated except that the glass ampule was charged with 4.8 parts of di-iPF, 4.8 parts of di-sBF, and 0.4 part of VDMAB and 0.01 part of Perloyl IPP was added as a radical polymerization initiator, obtaining a copolymer of di-iPF/di-sBF/VDMAB.

Synthesis Example 22

The procedure of Synthesis Example 19 was repeated except that the glass ampule was charged with 3.5 parts of di-sBF, 5.5 parts of di-cHF, and 0.1 part of VtBB and 0.01 part of Perloyl NPP as a radical polymerization initiator and 2 parts of pure benzene were added thereto, obtaining a copolymer of di-sBF/di-cHF/VtBB.

Synthesis Example 23

Radical polymerization was carried out as in Synthesis Example 1 except that there were used 10 parts of tB-iPF (as in Synthesis Example 5) as the monomer and Perloyl NPP (as in Synthesis Example 6) as the radical polymerization initiator. At the end of polymerization, benzene was admitted into the ampule to dissolve the thus produced polymer to form a polymer solution. The polymer solution was poured into a large volume of methanol, allowing a polymer to precipitate. The polymer was isolated, repeatedly re-precipitated from a benzene-methanol mixture, and dried in vacuum, obtaining an end polymer.

Synthesis Example 24

The procedure of Synthesis Example 23 was repeated except that di-cHF was used as the monomer, obtaining a polymer of di-cHF.

Synthesis Example 25

The procedure of Synthesis Example 23 was repeated except that 8 parts of di-cHF and 2 parts of di-iPF (as in Synthesis Example 8) were used as the monomers, obtaining a copolymer of di-cHF/di-iPF.

Synthesis Example 26

The procedure of Synthesis Example 23 was repeated except that 5 parts of di-cHF and 5 parts of di-iPF (as in Synthesis Example 8) were used as the monomers, obtaining a copolymer of di-cHF/di-iPF.

Synthesis Example 27

The procedure of Synthesis Example 23 was repeated except that 6 parts of di-cHF and 4 parts of di-sBF were used as the monomers, obtaining a copolymer of di-cHF/di-sBF.

Synthesis Example 28

The procedure of Synthesis Example 23 was repeated except that 5 parts of di-cHF and 5 parts of di-sBF were used as the monomers, obtaining a copolymer of di-cHF/di-sBF.

Synthesis Example 29

The procedure of Synthesis Example 23 was repeated except that 4.5 parts of di-cHF, 4.5 parts of di-iPF, and 1 part of St were used as the monomers, obtaining a copolymer of di-cHF/di-iPF/St.

Synthesis Example 30

The procedure of Synthesis Example 24 was repeated except that di-cHF was used as the monomer, obtaining a polymer of di-cHF.

Synthesis Example 31

The procedure of Synthesis Example 26 was repeated except that 5.8 parts of di-cHF and 4.2 parts of di-iPF were used as the monomers, obtaining a copolymer of di-cHF/di-iPF.

Synthesis Example 32

The procedure of Synthesis Example 27 was repeated except that 6.5 parts of di-cHF and 3.5 parts of di-sBF were used as the monomers, obtaining a copolymer of di-cHF/di-sBF.

Tables 1 to 5 show the number average molecular weight (Mn) of the polymers and copolymers obtained in Synthesis Examples 1 to 32. It is noted that the molecular weight was determined through measurement by gel permeation chromatography (GPC) using a column with an exclusion limit of 10,000,000 and calculation based on standard polystyrene. The polymers and copolymers were identified by proton-NMR and IR.

The following procedures were carried out using the polymers obtained in Synthesis Examples.

Example 1

After the polymers obtained in Synthesis Examples 1 to 22 were individually purified, 0.5 grams of each polymer was dissolved in 50 ml of benzene to form a polymer solution. The polymer solution was subject to pressure filtration for further removing insoluble matter, obtaining a solution which was uniform in viscosity. The solutions had a viscosity of about 500 to 700 centipoise in normal conditions.

The solution was poured in a flat dish having a flat smooth bottom and a diameter of 20 cm. Benzene was slowly evaporated so that no dust or debris might deposit, obtaining a transparent uniform specimen of 12 cm×12 cm×100 $\mu$m (thick). The specimen was examined for softening temperature and adhesion and subjected to a breakdown test.

Softening Temperature

It was measured according to JIS K-7126 using a tester TMA 100 (manufactured by Seiko Electronic Industry K. K.).

Adhesion

Copper was vacuum evaporated on a specimen to a thickness of 3 to 5 $\mu$m. The copper clad specimen was subject to a 180° peeling test using adhesive tape Cellotape®, observing how the Cu coating was peeled. The specimens were evaluated for adhesion in four ratings "⊙" for excellent adhesion, ""○ for good adhesion, "Δ" for fair adhesion and "X" for poor adhesion.

Breakdown Test

The test was carried out according to JIS C-2110.

The film specimens (formed on the flat dishes) with some solvent left therein were placed one on top of another. The laminate was heated in a drying oven at 40 to 60° C. to remove the solvent and then cut into an electrically insulating substrate of 12 cm×2.0 mm×2.0 mm. These substrates were examined for dielectric characteristics. The dielectric characteristics tested were a dielectric constant $\epsilon$ and a dielectric dissipation factor tan$\delta$ as measured at 1 GHz, 2 GHz, and 5 GHz by a perturbation method.

The results are shown in Tables 1 and 2. It is noted that in Tables 1 and 2, specimens and substrates corresponding to the polymers synthesized in Synthesis Examples 1 to 22 are designated sample Nos. 1 to 22, respectively. The monomer (s) from which each polymer was derived and their ratio are also shown together with the number of Synthesis Example.

TABLE 1

| Sample No. | Polymer Synthesis Example | Monomers in polymerizing system Monomer 1 | Monomers in polymerizing system Monomer 2 | Monomer content in polymerizing system Monomer 1 (wt %) | Monomer content in polymerizing system Monomer 2 (wt %) | Molecular weight (Mn) |
|---|---|---|---|---|---|---|
| 1 | (1) | di-iPF | — | 100 | 0 | 12.4 × 10⁴ |
| 2 | (2) | di-cHF | — | 100 | 0 | 14.5 × 10⁴ |
| 3 | (3) | di-sBF | — | 100 | 0 | 11.5 × 10⁴ |
| 4 | (4) | di-tBF | — | 100 | 0 | 13.5 × 10⁴ |
| 5 | (5) | tB-iPF | — | 100 | 0 | 22.1 × 10⁴ |
| 6 | (6) | di-iPF | di-sBF | 60 | 40 | 18.5 × 10⁴ |
| 7 | (7) | tB-iPF | di-iPF | 80 | 20 | 17.2 × 10⁴ |
| 8 | (8) | di-iPF | di-cHF | 50 | 50 | 17.3 × 10⁴ |
| 9 | (9) | di-iPF | nBu-iPF | 80 | 20 | 12.5 × 10⁴ |
| 10 | (10) | di-iPF | nHex-iPF | 70 | 30 | 20.7 × 10⁴ |
| 11 | (11) | di-cHF | nBu-iPF | 50 | 50 | 14.9 × 10⁴ |
| 12 | (12) | di-iPF | St | 80 | 20 | 14.5 × 10⁴ |
| 13 | (13) | di-sBF | VtBB | 80 | 20 | 12.7 × 10⁴ |
| 14 | (14) | di-cHF | VEMB | 70 | 30 | 18.4 × 10⁴ |
| 15 | (15) | di-iPF | VtBB | 80 | 20 | 14.5 × 10⁴ |
| 16 | (16) | di-iPF | VDMAB | 60 | 40 | 8.4 × 10⁴ |
| 17 | (17) | di-cHF | VtBB | 70 | 30 | 11.5 × 10⁴ |
| 18 | (18) | cH-iPF | VAc | 80 | 20 | 15.4 × 10⁴ |

TABLE 1-continued

| Sample No. | Dielectric constant ε (measured frequency) 1 GHz/2 GHz/5 GHz | Dielectric dissipation factor tanδ (measured frequency) 1 GHz/2 GHz/5 GHz | Softening temp. (° C.) | Adhesion to metal | Breakdown strength (kV/mm) |
|---|---|---|---|---|---|
| 1 | 2.3/2.2/2.3 | 5.0/4.9/5.3(×10$^{-3}$) | 265 | ○ | 67.5 |
| 2 | 1.8/1.8/2.0 | 1.8/1.8/1.9(×10$^{-3}$) | 305 | ○ | 72.2 |
| 3 | 2.1/2.1/2.2 | 6.5/6.6/6.6(×10$^{-3}$) | 282 | ○ | 68.5 |
| 4 | 1.9/1.7/1.8 | 4.5/4.5/4.6(×10$^{-3}$) | 203 | ○ | 78.3 |
| 5 | 2.0/2.0/1.8 | 3.4/3.3/3.4(×10$^{-3}$) | 220 | ○ | 65.9 |
| 6 | 2.2/2.2/2.4 | 5.4/5.3/6.4(×10$^{-3}$) | 248 | ○ | 72.4 |
| 7 | 2.0/2.0/1.8 | 3.3/3.3/3.4(×10$^{-3}$) | 243 | ⊚ | 44.5 |
| 8 | 1.9/2.1/1.9 | 3.6/3.7/4.2(×10$^{-3}$) | 262 | ⊚ | 69.4 |
| 9 | 2.2/2.3/2.2 | 8.5/8.7/8.5(×10$^{-3}$) | 280 | ⊚ | 75.5 |
| 10 | 2.2/2.2/2.0 | 6.6/6.5/6.0(×10$^{-3}$) | 270 | ⊚ | 64.5 |
| 11 | 1.8/1.8/1.9 | 5.8/5.7/6.2(×10$^{-3}$) | 285 | ○ | 94.5 |
| 12 | 2.2/2.2/2.3 | 4.6/4.5/4.7(×10$^{-3}$) | 246 | ○ | 46.4 |
| 13 | 2.2/2.2/2.3 | 5.2/5.1/5.5(×10$^{-3}$) | 285 | ⊚ | 58.1 |
| 14 | 2.5/2.4/2.3 | 4.6/4.5/4.7(×10$^{-3}$) | 265 | ⊚ | 62.5 |
| 15 | 2.2/2.2/2.3 | 7.4/7.2/7.6(×10$^{-3}$) | 220 | ⊚ | 84.5 |
| 16 | 2.5/2.5/2.3 | 6.5/6.3/6.5(×10$^{-3}$) | 315 | ⊚ | 58.5 |
| 17 | 1.9/1.9/2.0 | 4.6/4.5/4.8(×10$^{-3}$) | 340 | ○ | 78.2 |
| 18 | 2.4/2.3/2.3 | 4.9/4.5/4.7(×10$^{-3}$) | 295 | ⊚ | 74.8 |

TABLE 2

| Sample No. | Polymer Synthesis Example | Monomer content in polymerizing system | | | Monomer content in polymerizing system | | | Molecular weight (Mn) |
|---|---|---|---|---|---|---|---|---|
| | | Monomer 1 | Monomer 2 | Monomer 3 | Monomer 1 (wt %) | Monomer 2 (wt %) | Monomer 3 (wt %) | |
| 19 | (19) | di-tBF | di-cHF | VtBB | 40 | 50 | 10 | 12.1 × 10$^4$ |
| 20 | (20) | di-iPF | di-cHF | VEMB | 45 | 45 | 10 | 14.5 × 10$^4$ |
| 21 | (21) | di-iPF | di-sBF | VDMAB | 48 | 48 | 4 | 11.0 × 10$^4$ |
| 22 | (22) | di-sBF | di-cHF | VtBB | 35 | 55 | 10 | 13.7 × 10$^4$ |

| Sample No. | Dielectric constant ε (measured frequency) 1 GHz/2 GHz/5 GHz | Dielectric dissipation factor tanδ (measured frequency) 1 GHz/2 GHz/5 GHz | Softening temp. (° C.) | Adhesion to metal | Breakdown strength (kV/mm) |
|---|---|---|---|---|---|
| 19 | 1.9/2.0/1.8 | 3.4/3.3/3.4(×10$^{-3}$) | 220 | ○ | 64.2 |
| 20 | 1.9/1.9/1.8 | 3.3/3.1/3.2(×10$^{-3}$) | 307 | ○ | 55.4 |
| 21 | 2.2/2.1/2.2 | 3.6/3.5/3.9(×10$^{-3}$) | 284 | ⊚ | 72.3 |
| 22 | 2.1/2.0/2.0 | 3.7/3.6/3.8(×10$^{-3}$) | 314 | ○ | 58.5 |

Example 2

After the polymers obtained in Synthesis Examples 23 to 29 were individually purified, each polymer was dissolved in toluene to form a 10 to 30% by weight polymer solution having a viscosity of about 500 to 700 centipoise in normal conditions. Glass cloth of glass fibers (thickness 60±2 μm, D glass manufactured by Sakai Sangyo Co., Ltd.) was impregnated with the polymer by dipping 10 to 25% by weight of the cloth in the solution and drying the cloth in a drying oven at 40 to 80° C. for 4 hours to remove the solvent such that the cloth as finally dried bore 10 to 50% by weight of the solid resin. A glass fiber-containing electrically insulating film of 80±5 μm thick was obtained. Ten to twenty five sheets of the film were laminated to a predetermined thickness and the laminate was pressed under a pressure of 2 to 5 kg/cm in the drying oven at 40 to 60° C. again. There was obtained a glass fiber-containing electrically insulating substrate of predetermined dimensions: 2 mm×2 mm×12 cm.

Another glass fiber-containing electrically insulating substrate was similarly fabricated except that the glass cloth of D glass was replaced by glass cloth of T glass (thickness 60±2 μm, T glass manufactured by Sakai Sangyo Co., Ltd.).

These glass fiber-containing electrically insulating substrates were examined for dielectric characteristics as in Example 1. They were also subject to a soldering heat resistance test which was carried out as follows.

Soldering Heat Resistance Test

The test was carried out according to JIS C-0054 by dipping a sample in a solder bath at 260° C. for 120 seconds. The samples were evaluated for heat resistance in four ratings "⊚" for excellent heat resistance, "○" for good heat resistance, "Δ" for fair heat resistance without deformation and "X" for poor heat resistance and deformation.

The results are shown in Table 3. It is noted that in Table 3, glass fiber-containing electrically insulating substrates corresponding to the polymers synthesized in Synthesis Examples 23 to 29 and the glass clothes are designated sample Nos. 33 to 46, respectively (odd numbers for D glass and even numbers for T glass). The monomer(s) from which each polymer was derived and their ratio are also shown together with the number of Synthesis Example. A percent glass fraction of glass cloth is also reported.

TABLE 3

| Sample No | Polymer Synthesis Example | Monomers in polymerizing system | | | Monomer content in polymerizing system | | |
|---|---|---|---|---|---|---|---|
| | | Monomer 1 | Monomer 2 | Monomer 3 | Monomer 1 (wt %) | Monomer 2 (wt %) | Monomer 3 (wt %) |
| 33 | (23) | tB-iPF | — | — | 100 | 0 | 0 |
| 34 | (23) | tB-iPF | — | — | 100 | 0 | 0 |
| 35 | (24) | di-cHF | — | — | 100 | 0 | 0 |
| 36 | (24) | di-cHF | — | — | 100 | 0 | 0 |
| 37 | (25) | di-cHF | di-iPF | — | 80 | 20 | 0 |
| 38 | (25) | di-cHF | di-iPF | — | 80 | 20 | 0 |
| 39 | (26) | di-cHF | di-iPF | — | 50 | 50 | 0 |
| 40 | (26) | di-cHF | di-iPF | — | 50 | 50 | 0 |
| 41 | (27) | di-cHF | di-sBF | — | 60 | 40 | 0 |
| 42 | (27) | di-cHF | di-sBF | — | 60 | 40 | 0 |
| 43 | (28) | di-cHF | di-sBF | — | 50 | 50 | 0 |
| 44 | (28) | di-cHF | di-sBF | — | 50 | 50 | 0 |
| 45 | (29) | di-cHF | di-iPF | St | 45 | 45 | 10 |
| 46 | (29) | di-cHF | di-iPF | St | 45 | 45 | 10 |

| Sample No | Molecular weight (Mn) | Glass cloth Type | Fraction (wt %) | Dielectric constant $\epsilon$ (measured frequency) 1 GHz/2 GHz/5 GHz | Dielectric dissipation factor tan$\delta$ (measured frequency) 1 GHz/2 GHz/5 GHz | Soldering heat resistance (260° C. × 120 sec.) |
|---|---|---|---|---|---|---|
| 33 | $25.7 \times 10^4$ | D-glass | 50 ± 5 | 2.21/2.22/2.23 | 3.13/3.01/3.42($\times 10^{-3}$) | ○ |
| 34 | $25.7 \times 10^4$ | T-glass | 50 ± 5 | 2.57/2.54/2.52 | 4.50/5.08/5.48($\times 10^{-3}$) | ○ |
| 35 | $19.5 \times 10^4$ | D-glass | 50 ± 5 | 2.33/2.32/2.26 | 1.77/1.86/2.15($\times 10^{-3}$) | ⊙ |
| 36 | $19.5 \times 10^4$ | T-glass | 50 ± 5 | 2.55/2.50/2.48 | 4.10/4.41/5.06($\times 10^{-3}$) | ⊙ |
| 37 | $21.9 \times 10^4$ | D-glass | 50 ± 5 | 2.46/2.45/2.31 | 2.73/2.70/2.82($\times 10^{-3}$) | ⊙ |
| 38 | $21.9 \times 10^4$ | T-glass | 50 ± 5 | 2.59/2.56/2.55 | 4.16/4.41/5.02($\times 10^{-3}$) | ⊙ |
| 39 | $23.5 \times 10^4$ | D-glass | 50 ± 5 | 2.13/2.09/1.98 | 1.82/2.01/2.17($\times 10^{-3}$) | ⊙ |
| 40 | $23.5 \times 10^4$ | T-glass | 50 ± 5 | 2.86/2.83/2.70 | 4.06/4.80/5.40($\times 10^{-3}$) | ⊙ |
| 41 | $21.6 \times 10^4$ | D-glass | 50 ± 5 | 2.21/2.17/1.99 | 2.37/2.14/2.20($\times 10^{-3}$) | ⊙ |
| 42 | $21.6 \times 10^4$ | T-glass | 50 ± 5 | 2.98/2.95/2.83 | 4.79/4.93/5.51($\times 10^{-3}$) | ⊙ |
| 43 | $19.9 \times 10^4$ | D-glass | 50 ± 5 | 2.31/2.29/2.27 | 2.04/2.30/2.81($\times 10^{-3}$) | ⊙ |
| 44 | $19.9 \times 10^4$ | T-glass | 50 ± 5 | 2.17/2.15/2.18 | 3.70/4.09/4.71($\times 10^{-3}$) | ⊙ |
| 45 | $13.9 \times 10^4$ | D-glass | 50 ± 5 | 2.36/2.35/2.33 | 2.42/2.12/2.55($\times 10^{-3}$) | ○ |
| 46 | $13.9 \times 10^4$ | T-glass | 50 ± 5 | 2.75/2.74/2.66 | 4.47/4.75/5.47($\times 10^{-3}$) | ○ |

Comparative Example 1

Resin substrates of predetermined dimensions: 2 mm×2 mm×12 cm were fabricated as in Examples 1 and 2 except that commercially available resins were used instead of the polymers used in Examples 1 and 2.

The resins used were low density polyethylene (LDPE) by Idemitsu Petro-Chemical Co. Ltd., polyphenylene ether (PPE) by Dupont-Mitsui Poly-Chemical Co. Ltd., polystyrene (PS) by Mitsui-Toatsu Chemicals Inc., polycarbonate (PC) by Mitsubishi Gas Chemical Company Inc., polymethyl methacrylate (PMMA) by Asahi Chemical Industry Co. Ltd., Teflon (TF) by Nippon Valqua Industries, Ltd., glass fiber-reinforced epoxy resin (GE) substrate by Sumitomo Bakelite Co. Ltd., and thermosetting polyphenylene oxide (PPO) substrate by Matsushita Electric Works Ltd.

Resin substrates corresponding to these resins are designated sample Nos. 51 to 58, respectively, in the described order.

These resin substrates were examined for dielectric characteristics as in Example 1. They were also examined for softening temperature, adhesion and breakdown strength using film specimens as in Example 1.

The results are shown in Table 4.

TABLE 4

| Sample No. | Resin (type) | Dielectric constant $\epsilon$ (measured frequency) 1 GHz/2 GHz/5 GHz | Dielectric dissipation factor tan$\delta$ (measured frequency) 1 GHz/2 GHz/5 GHz | Softening temp. (° C.) | Adhesion to metal | Breakdown strength (kV/mm) |
|---|---|---|---|---|---|---|
| 51* | LDPE (thermoplastic) | 2.1/2.1/2.0 | 2.1/2.0/2.3($\times 10^{-3}$) | 34 | X | 17.9 |
| 52* | PPE (thermoplastic) | 3.8/3.7/3.2 | 6.3/5.9/6.2($\times 10^{-3}$) | 168 | Δ | 34.5 |
| 53* | PS (thermoplastic) | 2.5/2.5/2.3 | 0.2/0.2/0.4($\times 10^{-3}$) | 114 | Δ | 24.6 |
| 54* | PC (thermoplastic) | 2.7/2.8/2.7 | 6.0/7.2/7.5($\times 10^{-3}$) | 142 | X | 37.2 |
| 55* | PMMA (thermoplastic) | 2.4/2.5/2.4 | 8.9/8.4/8.6($\times 10^{-3}$) | 128 | ○ | 21.5 |

TABLE 4-continued

| Sample No. | Resin (type) | Dielectric constant ε (measured frequency) 1 GHz/2 GHz/5 GHz | Dielectric dissipation factor tanδ (measured frequency) 1 GHz/2 GHz/5 GHz | Softening temp. (° C.) | Adhesion to metal | Breakdown strength (kV/mm) |
|---|---|---|---|---|---|---|
| 56* | TF (thermoplastic) | 2.0/2.0/1.9 | 2.5/1.6/2.2(×10⁻³) | 280 | X | 35.0 |
| 57* | GE (thermosetting) | 4.1/4.2/4.2 | 6.8/7.4/8.1(×10⁻³) | — | ⊚ | 35.0 |
| 58* | PPO (thermosetting) | 3.5/3.6/3.7 | 5.5/5.9/6.9(×10⁻³) | — | ⊚ | 21.5 |

*(comparison)

Example 3

The polymers synthesized in Synthesis Examples 30, 31 and 32 are designated polymers A, B and C, respectively. As in Example 2, a solution of each of polymers A, B and C was prepared, glass cloth (thickness 60±2 μm, D glass manufactured by Sakai Sangyo Co. Ltd.) was dipped therein and vacuum impregnating treatment was carried out at 25 to 30° C. and 760 mmHg for 15 to 30 minutes. The glass cloth was drawn out of the impregnating bath at a rate of 30 to 50 cm/min. and carried through a drying oven at 40 to 60° C. at a rate of 30 cm/min.

Since the glass cloth was a length of glass cloth wound in roll form having a width of 100 mm, the impregnating process was carried out by unraveling the cloth from the roll.

The impregnated glass cloth had a residual solvent content of 5 to 7% by weight after drying as mentioned above. With the solvent left, the impregnated cloth was cut into sections of 100 mm long. The impregnated cloth had a thickness of about 70 μm. Ten to thirty sections whose residual solvent content was kept unchanged were laminated while a solution of polymer A, B or C was applied as a resin glue for increasing the polymer content. The laminate was pressed at 40 to 60° C. and 5 to 7 kg/cm for 30 to 60 minutes. The resin glues of polymers A, B and C had a polymer concentration of 15%, 12% and 12% by weight, respectively. This pressure lamination resulted in a laminate substrate of 0.6 mm thick in which some solvent was still left. An external conductor-forming copper foil (electrodeposited copper foil, 35 μm thick) was placed on one surface of the laminate substrate and press joined thereto at 60° C. and 7 kg/cm². On the other surface, an internal conductor-forming copper foil (rolled copper, 32 μm thick) and another substrate were alternately placed and pressure joined under the same conditions. This procedure was repeated and an external conductor-forming copper foil was press joined as the outermost layer on the other side. There was finally obtained a double side copper clad substrate of 100 mm long, 100 mm wide and 1.2 mm thick. After pressure bonding, the laminate was vacuum dried (760 mmHg, 30 minutes), air dried in normal conditions (25° C., 4 days), and finally dried at 60° C. for 8 hours.

The double side copper clad substrates corresponding to polymers A, B and C synthesized in Synthesis Examples 30, 31 and 32 are designated sample Nos. 60, 61 and 62, respectively. These sample Nos. 60 to 62 were examined for dielectric characteristics, copper tensile peel strength, soldering heat resistance, etching resistance, glass transition temperature (Tg), and coefficient of linear expansion (α) by the following methods. The results are shown in Table 5. Similar characteristics of commercially available double side copper clad substrates are also shown in Table 5. The monomer(s) from which each polymer was derived and their ratio are also shown together with the number of Synthesis Example.

It is noted that the laminate substrate portion of sample Nos. 60, 61 and 62 contained 50% by weight of polymer A, 48% by weight of polymer B, and 48% by weight of polymer C, respectively.

Dielectric Characteristics

A specimen of 100 mm long, 2 mm wide and 1.2 mm thick was cut out and measured for dielectric constant ε and dielectric dissipation factor tanδ at 1 GHz, 2 GHz, and 5 GHz by a perturbation method. A Q value was calculated therefrom.

Cu Tensile Peel Strength

A specimen of 100 mm long, 10 mm wide and 1.2 mm thick was cut out. A 180° peeling test using adhesive tape Cellotape® was carried out on the copper foil as the external conductor. The specimen was rated "O" (good) when peeling required a force of at least 2.0 kg/cm².

Soldering Heat Resistance Test

A specimen cut to dimensions of 100 mm long, 10 mm wide and 1.2 mm thick was dipped in a solder bath at 260° C. It was rated "O" (good) when no change of outer appearance (blister, deformation, lamination failure, discoloring, etc.) was observed after 120 seconds.

Etching Resistance

The substrate was dipped in a 10% by weight ferric chloride solution at 25° C. for 72 hours. It was rated "O" (good) when neither blister nor deglossing was observed.

Tg

It was measured by a dynamic mechanical analysis (DMA) method.

α

It was measured by a TMA method.

TABLE 5

| Substrate | Polymer Synthesis Example | Monomer (wt %) | Molecular weight (Mn) | Dielectric constant ε 1 GHz/2 GHz/5 GHz | tanδ (Q value) 1 GHz/2 GHz/5 GHz |
|---|---|---|---|---|---|
| 60 | (30) | di-cHF (100) | 18.0 × 10⁴ | 2.33/2.32/2.26 | 1.77 × 10⁻³/1.86 × 10⁻³/2.15 × 10⁻³ (565) (538) (466) |
| 61 | (31) | di-cHF/di-iPF (58/42) | 21.5 × 10⁴ | 2.13/2.09/1.98 | 1.82 × 10⁻³/2.01 × 10⁻³/2.17 × 10⁻³ (550) (497) (461) |

TABLE 5-continued

| | | | | | |
|---|---|---|---|---|---|
| 62 | (32) | di-cHF/di-sBF (65/35) | $21.4 \times 10^4$ | 2.21/2.17/1.99 | $2.37 \times 10^{-3}/2.14 \times 10^{-3}/2.29 \times 10^{-3}$ (422) (466) (454) |
| Commercial Products | | | | | |
| GE substrate | | | | 4.14/4.22/4.15 | $6.79 \times 10^{-3}/7.39 \times 10^{-3}/8.10 \times 10^{-3}$ (147) (135) (123) |
| PPO substrate | | | | 3.50/3.57/3.74 | $5.45 \times 10^{-3}/5.86 \times 10^{-3}/6.85 \times 10^{-3}$ (183) (171) (146) |
| PPE substrate I | | | | 3.33/3.33/4.01 | $3.85 \times 10^{-3}/4.63 \times 10^{-3}/5.84 \times 10^{-3}$ (260) (216) (171) |
| PPE substrate II | | | | 2.31/3.72/3.76 | $6.65 \times 10^{-3}/8.71 \times 10^{-3}/9.72 \times 10^{-3}$ (151) (115) (103) |
| Teflon substrate I | | | | 2.71/2.63/2.52 | $2.11 \times 10^{-3}/2.45 \times 10^{-3}/2.79 \times 10^{-3}$ (475) (409) (360) |
| Teflon substrate II | | | | —/3.0/3.2 | —/$3.1 \times 10^{-3}$/$3.7 \times 10^{-3}$ (—) (327) (270) |

| Substrate | α (20–200° C.) (ppm/° C.) | Tg (° C.) | Soldering heat resistance | Peel strength | Etching resistance |
|---|---|---|---|---|---|
| 60 | 2.0–14.8 | 290 | ○ | ○ | ○ |
| 61 | 2.2–6.6 | 290 | ○ | ○ | ○ |
| 62 | 3–8 | 280 | ○ | ○ | ○ |
| Commercial Products | | | | | |
| GE substrate | 70 | 153 | ○ | ○ | ○ |
| PPO substrate | — | — | ○ | ○ | ○ |
| PPE substrate I | 70–100 | 250 | ○ | ○ | ○ |
| PPE substrate II | 80–100 | 250 | ○ | ○ | ○ |
| Teflon substrate I | 21–100 | — | ○ | ○ | ○ |
| Teflon substrate II | — | — | ○ | ○ | ○ |

It is evident from Table 5 that substrate samples within the scope of the invention are characterized by low dielectric characteristics at a high frequency, that is, have excellent characteristics. As compared with the commercially available Teflon substrate, they exhibit at least equal characteristics. Their Q characteristics at a high frequency are excellent.

Example 4

Patch antenna substrates were fabricated using polymers A, B and C synthesized in Synthesis Examples 30, 31 and 32 (see Example 3). As in Example 3, glass cloth was impregnated with the polymer and cut into sections of 100 mm long, 100 mm wide and 70 μm thick, and 80 to 100 sections of the cloth were pressure laminated. As in Example 3, a solution of the polymer was applied as a resin glue for increasing the polymer content and improving adhesion. As in Example 3, an external conductor-forming copper foil (electrodeposited copper foil, 35 μm thick) was pressure bonded to one surface of the lamination substrate and another copper foil was similarly pressure bonded to the other surface. After drying, a section of 70.5 mm long, 70 mm wide and 8.3 to 8.7 mm thick was cut out, obtaining a patch antenna substrate. The lamination substrates had the same polymer contents as in Example 3. These antenna substrates are designated antenna substrates A, B and C in accordance with polymers A, B and C used therein, respectively.

A patch antenna as shown in FIG. 1 was assembled using the antenna substrate. As shown in FIG. 1, the patch antenna includes an antenna substrate 1, a radiating electrode 2 formed on an upper surface of the substrate 1 to predetermined dimensions calculated according to an approximate expression based on a resonant frequency of 1.575 GHz, for example, and a grounding plate 3 on a rear surface of the substrate 1. An SMA connector 4 is soldered to the grounding plate 3 for power supply from the rear surface. The SMA connector 4 has a center conductor 5 which is soldered to the radiating electrode 2. In a plan view (not shown), the center conductor 5 is positioned off the center of the substrate 1.

These antennas are designated antennas A, B and C in accordance with polymers A, B and C used therein, respectively.

The patch antennas A, B and C were examined for performance. Reflecting characteristics and radiation pattern were satisfactory. Since they are designed with a dielectric constant ε≈2.2, their size is greater than commonly used antennas, but falls within a practically acceptable range. With respect to the reflecting characteristics, a deviation from impedance 50 Ω was evaluated using reflectance. For measurement, a network analyzer model 1513A by Hewlett Packard was used. The radiation pattern was measured and evaluated using a spectral analyzer model 8513A by Hewlett Packard.

Example 5

Figure 2:
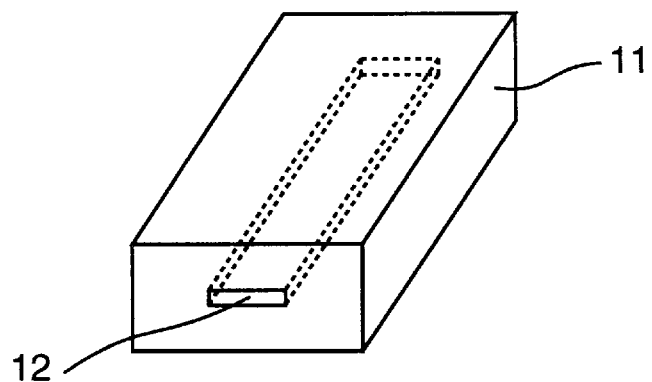
FIG. 2 is a perspective view of a tri-plate type resonator as another example of the electronic part according to the invention.

Tri-plate type resonators were fabricated using polymers A, B and C synthesized in Synthesis Examples 30, 31 and 32 (see Example 3). As in Example 3, glass cloth was impregnated with the polymer and cut into sections of 100 mm long, 100 mm wide and 70 μm thick, and twenty sections of the cloth were pressure laminated. Two such laminate substrates were furnished. One substrate was coated with the same resin glue as in Example 3, an internal conductor-forming copper foil (rolled copper, 2 mm wide, 32 μm thick) was attached thereto at a predetermined position, and the other substrate with some solvent left therein (a residual solvent content of about 15% by weight) was placed thereon and pressure bonded at 40 to 60° C. and 5 to 7 kg/cm² for 30 to 60 minutes. The assembly was vacuum dried at 760 mmHg (101.325 KPa) for 30 minutes, air dried under normal conditions at 25° C. for 2 days, and further dried at 40 to 60° C. and 5 kg/cm² for 60 minutes. The assembly was cut into a chip of predetermined dimensions of 26.6 mm long, 10 mm wide and 2 mm thick. The chip was nickel electroplated over its entire surface to a thickness of about 5 μm. One end surface was polished to expose the internal conductor, obtaining a tri-plate type resonator as shown in FIG. 2. As understood from the above-mentioned manufacturing process, the tri-plate type resonator shown in FIG. 2 includes a rectangular dielectric body 11 formed of polymer A, B or C and an electrode 12 serving as an internal conductor disposed at the center of the dielectric body 11. Only the one end surface where the electrode 12 is exposed is open while the remaining surfaces are metallized. These resonators are designated resonators A, B and C in accordance with polymers A, B and C used therein, respectively.

The resonator mentioned above has a length L which is determined in accordance with the following expression:

$$L = 299.75/4 \times 1.9 \times (\epsilon r)^{1/2}$$

wherein the dielectric material has a relative dielectric constant $\epsilon r$ of 2.3. The electrode serving as an internal conductor had a final thickness of 30 μm. The laminate substrate had the same polymer content as in Example 3.

The thus obtained tri-plate type resonators A, B and C were examined for dielectric characteristics at 1.9 GHz by a ¼ wavelength resonator method, finding that all the resonators had a Q value of 100 to 200 which falls in a practically acceptable range.

Example 6

Supports for $TE_{01\delta}$ mode dielectric resonators were prepared using polymers A, B and C synthesized in Synthesis Examples 30, 31 and 32 (see Example 3). As in Example 3, glass cloth was impregnated with the polymer and cut into sections of 100 mm long, 100 mm wide and 70 μm thick, and 320 sections of the cloth were pressure laminated. The laminate was cut to dimensions of 50 mm long, 50 mm wide and 30 mm thick. By polishing the outer periphery, the laminate was worked into a cylinder having a diameter of 30±0.1 mm, obtaining a support. The laminate support had the same polymer content as in Example 3. These supports are designated supports A, B and C in accordance with polymers A, B and C used therein, respectively.

Figure 3:
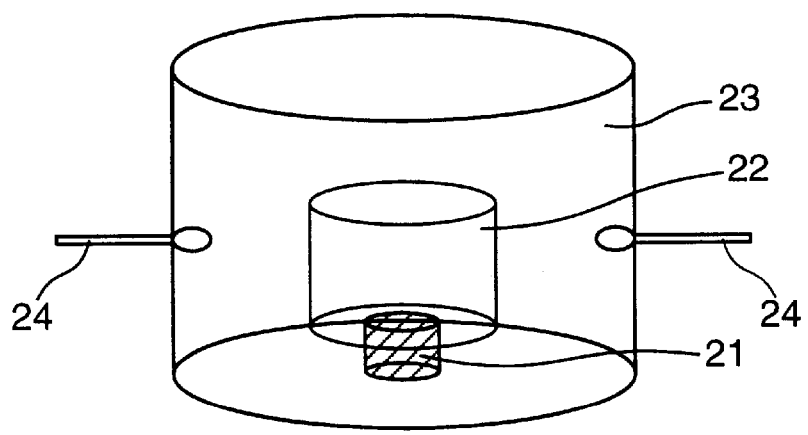
FIG. 3 is a perspective view of a $TE_{01}\delta$ mode dielectric resonator as a further example of the electronic part according to the invention.

Using the supports A, B and C, $TE_{01\delta}$ mode dielectric resonators as shown in FIG. 3 were fabricated. The resonator shown in FIG. 3 includes a support 21 and a microwave dielectric body 22 rested thereon and typically formed of a ceramic material. The support 21 and the microwave dielectric body 22 are accommodated in a case 23. An exciting loop 24 is attached to the case 23 at predetermined positions.

The microwave dielectric body 22 can be readily bonded to the support 21 using the same resin glue as in Example 3, and the resulting joint had sufficient strength.

The $TE_{01\delta}$ mode dielectric resonators using supports A, B and C were examined for dielectric characteristics by a $TE_{01\delta}$ dielectric resonator method, finding a Q value within the practically acceptable range.

In contrast, quartz and forsterite system ceramic materials used in conventional supports have the problem that because of their dielectric constant $\epsilon$ of 6 to 9, the electromagnetic field of $TE_{01\delta}$ mode distributed about the microwave dielectric body is largely affected by the support, resulting in reduced Q values. Further, since the microwave dielectric body rested on the support is made of a ceramic material, bonding of the support and the microwave dielectric body is difficult. Teflon having $\epsilon$ of ~2.2 can be used in experiments, but not in practice because of difficulty of bonding.

Although some preferred embodiments have been described, many modifications and variations may be made thereto in the light of the above teachings. It is therefore to be understood that within the scope of the appended claims, the invention may be practiced otherwise than as specifically described.

We claim:

1. A film comprising glass fibers impregnated with a polymer obtained by polymerizing a monomeric composition comprising at least a fumaric acid diester monomer, wherein the polymer is characterized by a dielectric constant ($\epsilon$) of at least 1, and a dielectric dissipation factor (tan δ) of up to 0.01, in a high frequency band of at least 500 MHz, and having a thickness of at least 30 μm.

2. The film of claim 1, wherein the monomeric composition comprises at least 50% by weight of the composition of the fumaric acid diester monomer and less than 50% by weight of the composition, but above 0%, of a vinyl monomer of the following formula (II):

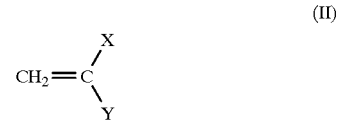

(II)

wherein X is a hydrogen atom or a methyl group and Y is selected from the class consisting of a fluorine atom, chlorine atom, alkyl group, alkenyl group, aryl group, ether group, acyl group, and ester group, and wherein the fumaric acid diester is of the formula (I)

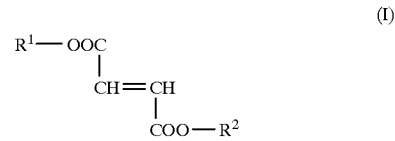

(I)

wherein $R^1$ is an alkyl or cycloalkyl group and $R^2$ is an alkyl, cycloalkyl or aryl group, $R^1$ and $R^2$ may be identical or different.

3. The film of claim 1 wherein the fumaric acid diester is of the following formula (I):

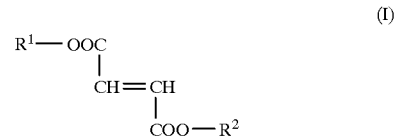

(I)

wherein $R^1$ is an alkyl or cycloalkyl group and $R^2$ is an alkyl, cycloalkyl or aryl group, $R^1$ and $R^2$ may be identical or different.

4. The film of claim 1 wherein said monomeric composition further contains a vinyl monomer of the following formula (II):

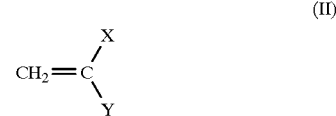

(II)

wherein X is a hydrogen atom or methyl group and Y is selected from the class consisting of a fluorine atom, chlorine atom, alkyl group, alkenyl group, aryl group, ether group, acyl group, and ester group.

5. A substrate comprising laminated sections of the film of claim 1.

6. An electronic part for use in a high frequency band of at least 500 MHz comprising the film of claim 1.

* * * * *